United States Patent [19]
Lemmens

[11] Patent Number: 5,708,375
[45] Date of Patent: Jan. 13, 1998

[54] MINIMUM PULSE WIDTH DETECTOR FOR A MEASUREMENT INSTRUMENT

[75] Inventor: Hubertus G. C. Lemmens, Enschede, Netherlands

[73] Assignee: Fluke Corporation, Everete, Wash.

[21] Appl. No.: 661,662

[22] Filed: Apr. 29, 1996

[51] Int. Cl.[6] .............................. G01R 29/02; H03K 5/26
[52] U.S. Cl. ........................ 327/36; 327/20; 327/26
[58] Field of Search .............................. 327/18, 19, 20, 327/21, 22, 23, 24, 25, 26, 27, 31, 34, 178, 164, 165, 166, 170, 172, 173, 174, 36, 37, 38, 39, 44, 47, 49

[56] References Cited

U.S. PATENT DOCUMENTS

| | | | |
|---|---|---|---|
| 3,735,271 | 5/1973 | Leibowitz | 327/36 |
| 3,749,895 | 7/1973 | Kao | 235/152 |
| 3,822,385 | 7/1974 | Kayalioglu | 327/34 |
| 4,142,159 | 2/1979 | Ingram et al. | 327/20 |
| 4,308,472 | 12/1981 | McLaughlin | 327/18 |
| 4,403,193 | 9/1983 | Takemura | 327/38 |
| 4,414,534 | 11/1983 | Whidden | 327/47 |
| 4,471,235 | 9/1984 | Sakhuja et al. | 327/34 |
| 4,698,829 | 10/1987 | Di Giulio | 327/20 |
| 4,988,901 | 1/1991 | Kamuro et al. | 327/18 |
| 5,523,708 | 6/1996 | Yamasaki | 327/20 |

*Primary Examiner*—Timothy P. Callahan
*Assistant Examiner*—Terry L. Englund
*Attorney, Agent, or Firm*—Douglas J. Barker

[57] ABSTRACT

A detector circuit operating in parallel with a bandwidth limited measurement channel in a measurement instrument generates a warning signal when an input signal exceeds a predetermined repetition rate or has a pulse width less than a predetermined value. To provide a warning signal to the measurement instrument that the input signal contains high frequency components that are likely to be missed by the measurement channel, the detector circuit operates in parallel with the measurement channel. A pulse width in the input signal that is sufficiently narrow or a repetition rate that is too high causes the detector to generate the warning signal that is provided to the measurement instrument.

10 Claims, 4 Drawing Sheets

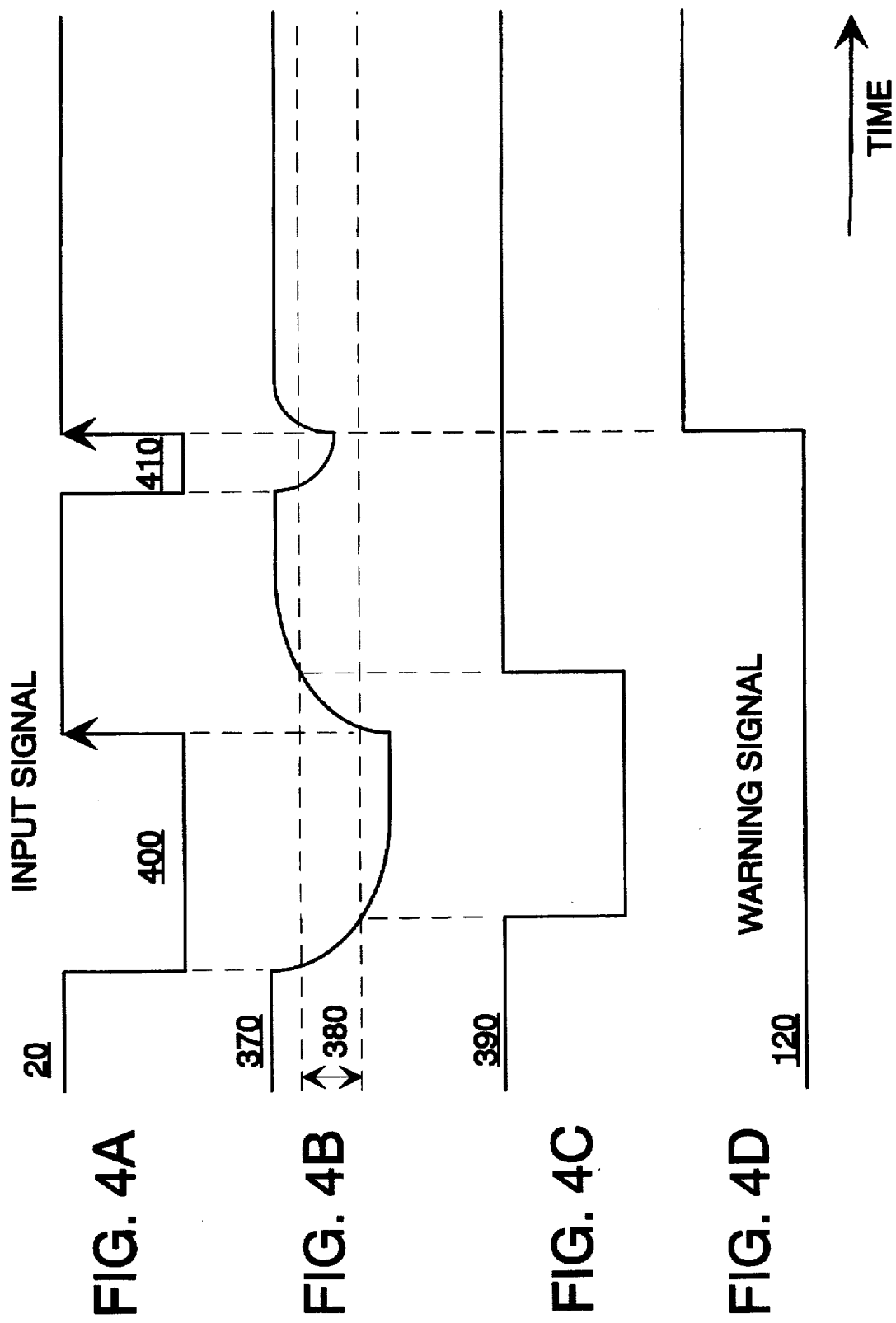

MINIMUM PULSE WIDTH DETECTOR FOR A MEASUREMENT INSTRUMENT

BACKGROUND OF THE INVENTION

This invention relates generally to electronic measurement instruments and in particular to a detector which provides a warning of input signals containing frequencies beyond the capability of a bandwidth limited measurement channel.

Electronic instruments may be required to measure input signals at a variety of different frequencies and pulse widths. Such input signals are either digital in nature or converted to a digital signal using appropriate input and trigger circuits. In particular, measurement instruments that measure frequency and pulse width of the input signal must be capable of detecting all of the pulses received from the input signal. An input channel within the measurement instrument which is bandwidth limited has a correspondingly limited ability to respond to the high frequency components of the input signal. If the high frequency components of the input signal, comprising either a repetition rate of the input signal which is too high or a pulse width that is too narrow for the measurement channel to respond to, measurement errors result because of the missed information. Such measurement errors need to be detected by the measurement instrument to avoid getting misleading results.

The traditional means of avoiding measurement errors from input signals with high frequency components is to filter the input signal to remove the high frequency components so that even the slowest channel of the measurement instrument can measure the input signal. In this way, the measurement instrument is unresponsive to input signals containing high frequencies or narrow pulse widths. The disadvantage of this approach is that input signals often contains a mix of high frequencies and low frequencies with no prior warning to the user. A narrow pulse width may unexpectedly show up in an input signal that contains predominantly wide pulse widths. Simply filtering the input signal would not provide any warning to the user of the measurement instrument that the narrow pulse width is present in the input signal and would be missed by the bandwidth limited measurement channel.

Therefore, it would be desirable to provide a detector circuit operating in parallel with the bandwidth limited measurement channel that would provide a warning when the input signal contains high frequency components which the measurement channel is likely to miss.

SUMMARY OF THE INVENTION

In accordance with the present invention, a detector circuit operating in parallel with a bandwidth limited measurement channel is provided which generates a warning signal when an input signal exceeds a predetermined repetition rate or a pulse width is less than a predetermined value. An input signal is applied to a measurement channel of the measurement instrument which typically contains a number of elements in the signal path such as buffers, transport channels, and input amplifiers which may operate to limit the bandwidth of the measurement channel and thus limit the ability of the measurement channel to respond to the input signal. For example, the buffer may be slew rate limited, with a finite amount of time required to change from one output state to another. The transport channel, typically comprising a printed circuit board trace, a wire, or a transmission line, may have a limited high frequency response and thus operate as a low pass filter in which higher frequencies are attenuated. The input amplifier may also be bandwidth limited. An input signal containing both low frequency and high frequency components may not be correctly received by the measurement channel because the high frequency components could be missed without any warning to the user, thereby resulting in misleading or incorrect measurement results.

To provide a warning that the input signal contains high frequency components that are likely to be missed by the input channel, the detector circuit operates in parallel with the input channel. The detector circuit detects positive and negative pulses by coupling the input signal to the clock inputs of a pair of flip flops. The input signal is further coupled through a low pass filter to a Schmitt trigger to the data inputs of the pair of flip flops. The cutoff frequency of the low pass filter is chosen to model the maximum repetition rate or minimum pulse width present in the input signal that can be handled without error by the measurement channel. The input signal may contain a pulse width that is sufficiently narrow or a repetition rate that is sufficiently high to cause the output of one or the other flip flop to be set depending on the polarity of the pulses causing the warning signal. An OR gate combines the outputs of the two flip flops to generate the warning signal.

One object of the present invention is to provide a detector circuit for detecting pulse widths less than a predetermined value.

Another object of the present invention is to provide a measurement instrument having a measurement channel that independently provides a warning of input signals having high frequency components exceeding the capability of the measurement channel.

An additional object of the present invention is to provide a detector circuit operating in parallel with a measurement channel for providing a warning signal when an input signal has high frequency components exceeding the capability of the measurement channel.

Other features, attainments, and advantages will become apparent to those skilled in the art upon a reading of the following description when taken in conjunction with the accompanying drawings.

BRIEF DESCRIPTION OF THE DRAWINGS

FIG. 4A–D together illustrate the operation of the detector of FIG. 3 in generating a warning signal.

DETAILED DESCRIPTION OF THE INVENTION

Figure 1:
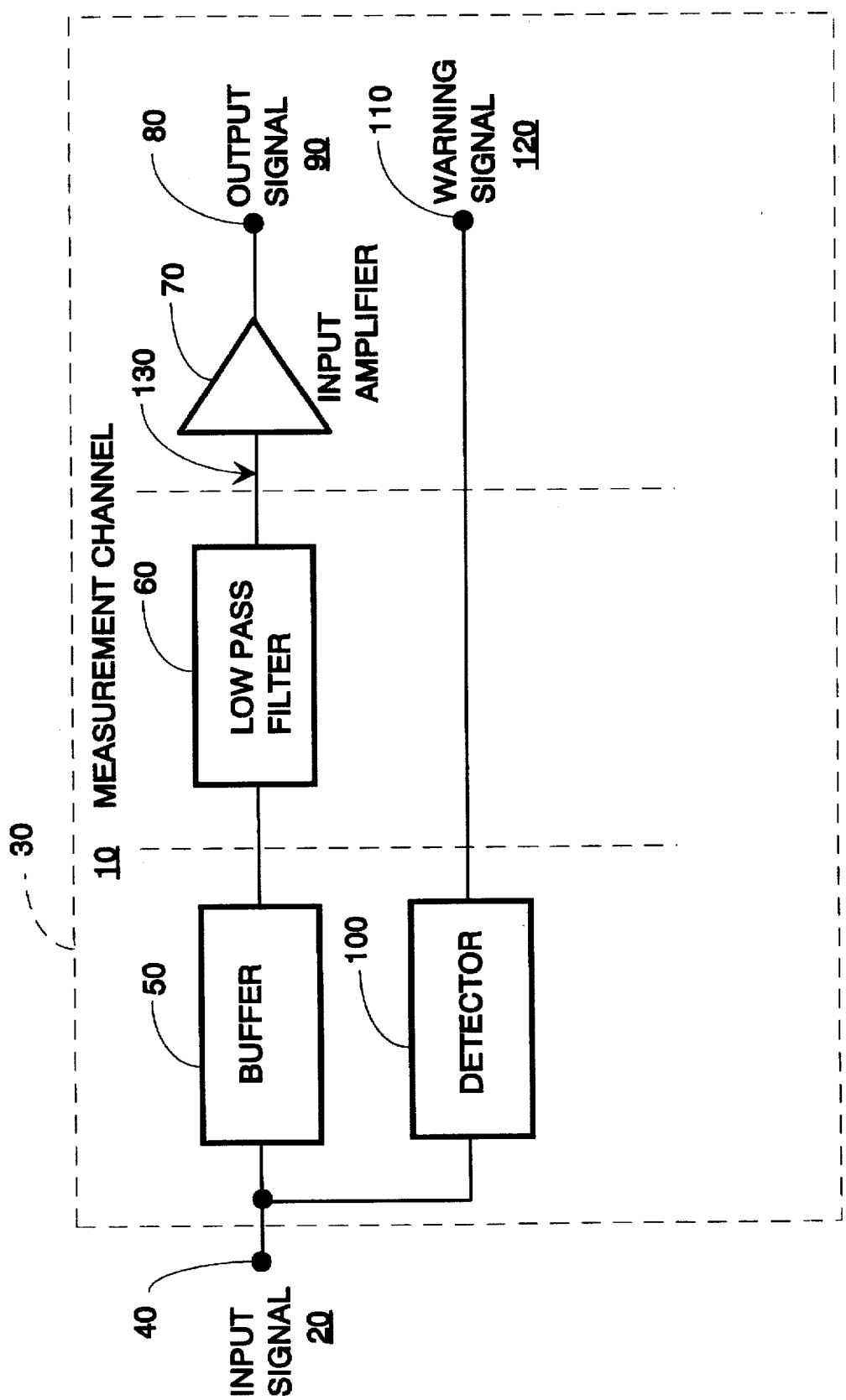
FIG. 1 is a simplified block diagram of a measurement channel of a measurement instrument containing a detector circuit for generating warning signals according to the present invention.

FIG. 1 is a simplified block diagram of a measurement channel 10 which is a component of a measurement instrument 30. An input signal 20 is coupled to an input terminal 40. The input signal 20 is a digital signal and may contain a variety of pulse widths and pulse repetition rates.

The input signal 20 is coupled via the terminal 40 to a buffer 50 which serves to provide voltage isolation between the measurement instrument 30 and the input signal 20. The buffer 50 may comprise an amplifier or voltage follower that provides a high input impedance and generates a signal at an output responsive to the input signal 20. Because the input signal 20 is a digital signal, the transition time from one state to another may be limited by the slew rate of buffer 50.

The output of the buffer 50 is coupled to an input amplifier 70 through a low pass filter 60. The low pass filter 60 may comprise a transport channel for the input signal 20 such as a printed circuit board trace, a wire, or a transmission line. The transport channel has a limited bandwidth which attenuates high frequency components of the input signal 20. The high frequency component of the input signal means either a high pulse repetition rate or a narrow pulse width. This low pass filtering effect is typically not desirable but is an artifact of the connection between the buffer 50 and the input amplifier 70. Such low pass filter effects can often be reduced although not entirely eliminated using high frequency design techniques known in the art.

The input amplifier 70 is digital in nature and develops an output signal 90 in response to changes in state at its input only when the voltage passes above or below predetermined threshold values. The output signal 90 is coupled to terminal 80 which may then be coupled to remaining portions of the measurement instrument 30. A detector 100 has an input coupled to the terminal 40 to receive the input signal 20 in parallel with the measurement channel 10 to develop a warning signal 120 at a terminal 110 according to the present invention as explained more fully below.

Figure 2:
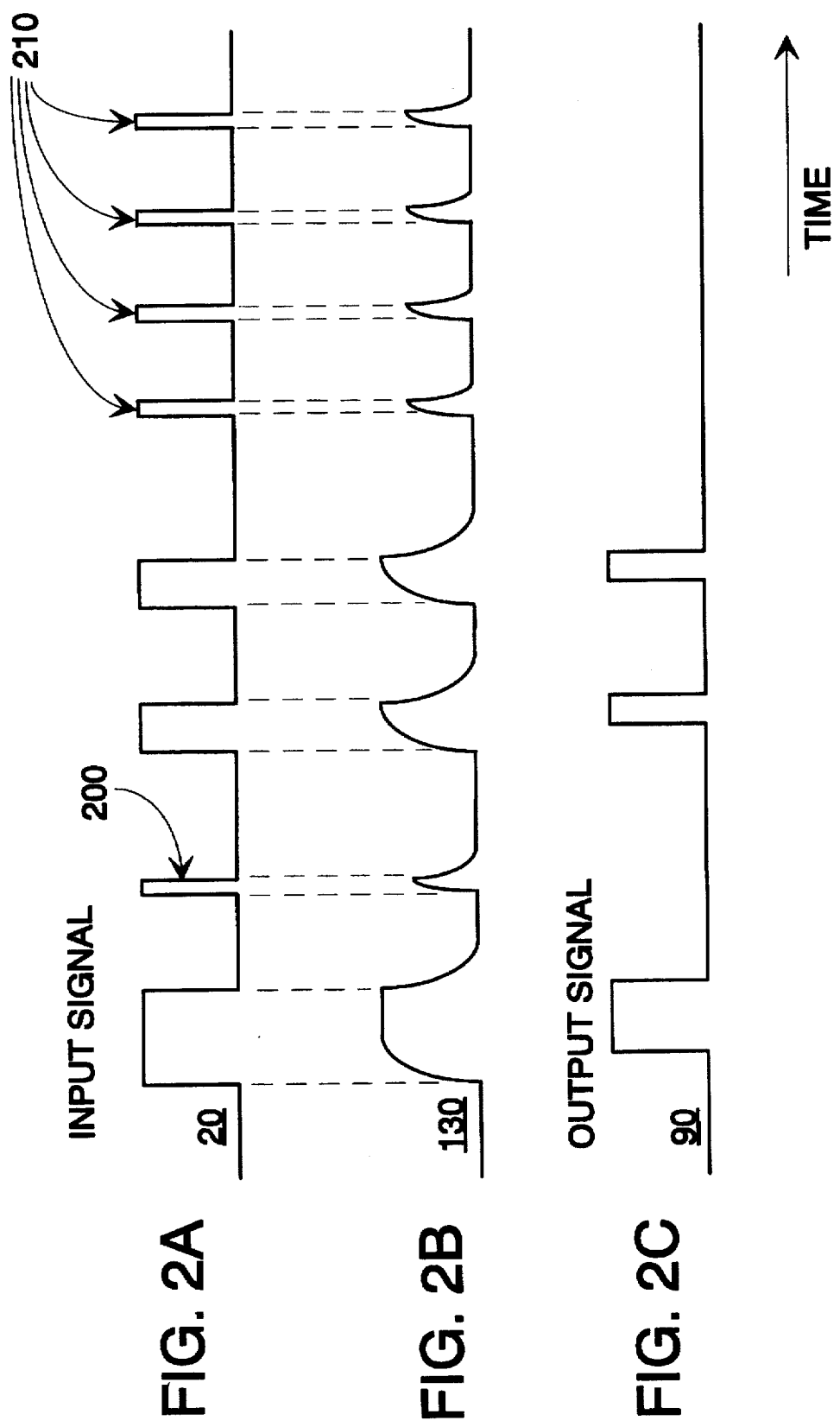
FIG. 2A–C together illustrate the effects of the measurement channel of FIG. 1 on an input signal containing high frequency components exceeding the capability of the measurement channel.

FIG. 2A-C together illustrate the effects of the measurement channel of FIG. 1 on an input signal containing high frequency components exceeding the capability of the measurement channel. FIG. 2A is a graph of the input signal 20 expressed in terms of amplitude versus time as would typically appear containing both low frequency and high frequency components. The narrow pulse width 200 and the high repetition rate pulses 210 represent typical high frequency components.

FIG. 2B is a graph of the input signal 20 which appears as a distorted signal 130 that appears at the input of the input amplifier 70 after having passed through the buffer 50 and the low pass filter 60. The narrow pulse width 200 and the high repetition rate pulses 210 appear substantially attenuated in amplitude.

FIG. 2C is a graph of the output signal 90 which is generated by the input amplifier 70 in response to the distorted signal 130. Because the narrow pulse width 200 and the high repetition rate pulses are attenuated below a predetermined level for the input amplifier 70 to change states, no corresponding pulses are generated in the output signal 90.

Figure 3:
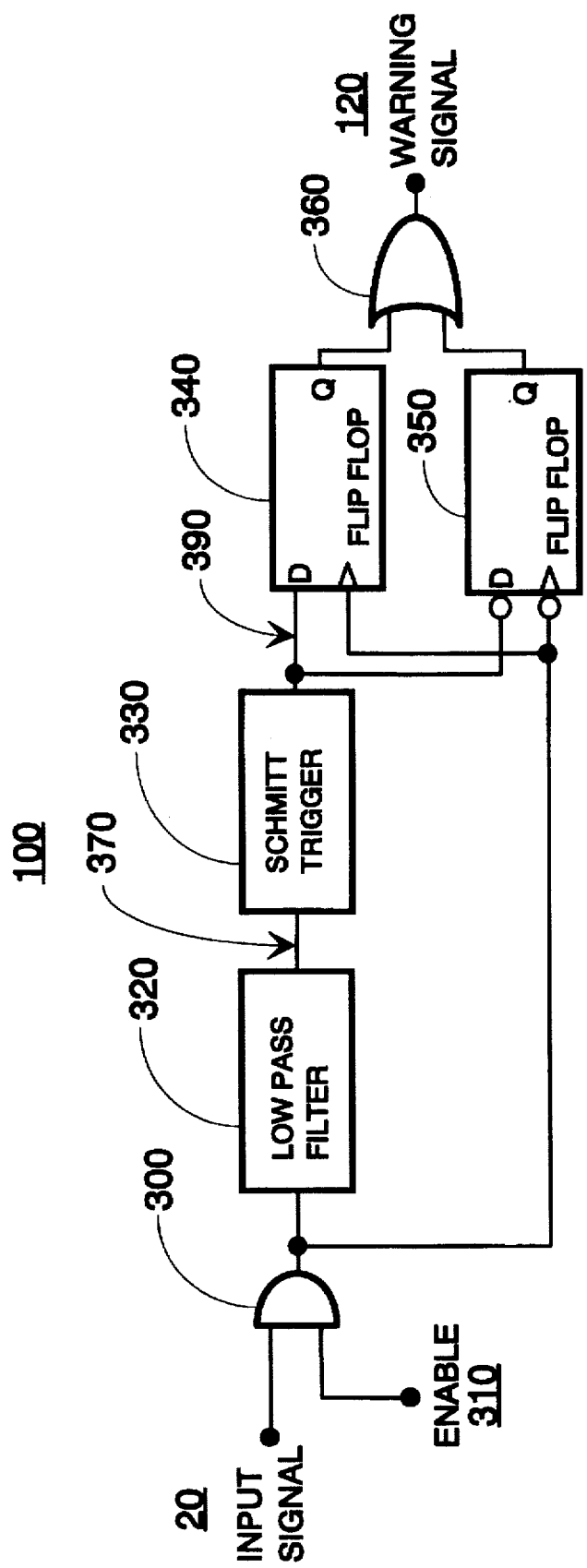
FIG. 3 is a simplified block diagram of the detector circuit according to the present invention.

FIG. 3 is a simplified block diagram of the detector 100 (shown in FIG. 1) according to the present invention. The input signal 20 is coupled to an input of an AND gate 300. An enable signal 310 is coupled to another input of the AND gate 300 which has an output coupled to a low pass filter 320. The input signal 20 is switched on and off at the output of the AND gate 300 responsive to the enable signal 310. The low pass filter 320 has frequency attenuation characteristics selected to correspond to the low pass filter 60 of the measurement channel 10. The low pass filter 320 may be constructed according to a variety of low pass filter circuits known in the art and with a filter shape that may be selected depending on the application.

The low pass filter 320 provides a filtered input signal 370 to a Schmitt trigger 330 which in turn provides a trigger signal 390 to a data input of a flip flop 340 and to an inverted data input of a flip flop 350. The Schmitt trigger 330 is a voltage level detector which provides a hysteresis window in which the filtered input signal 370 must pass through a voltage band consisting of an upper and a lower voltage limit in order for the trigger signal 390 to change states. Hysteresis bands provide for noise immunity for signals near a voltage limit. Other types of voltage level detectors may be employed, such as window detectors, depending on considerations of noise immunity and required versatility in triggering.

The filtered input signal 370 is the input signal 20 less the high frequency components which have been selectively blocked by the low pass filter 320. The output of the AND gate 300 is coupled to a clock input of the flip flop 340 and inverted clock input of the flip flop 350. The flip flops 340 and 350 each have an output coupled to an input of an OR gate 360 which in turn generates the warning signal 120. The OR gate 360 functions as a summing node to combine the outputs of the flip flops 340 and 350. The flip flops 340 and 350 have the capability to respond to the high frequency components anticipated to be encountered within the input signal 20 in which a warning signal 120 must be generated.

FIG. 4A-D together illustrate the operation of the detector of FIG. 3 in generating a warning signal 120. In FIG. 4A, there is shown a portion of the input signal 20 containing a wide pulse width 400 and a narrow pulse width 410. In FIG. 4B, there is shown the filtered input signal 370 which is the input signal 20 after passing through the low pass filter 320. Superimposed on the filtered input signal 370 is a hysteresis band 380 consisting of the upper and lower voltage levels which is present in the Schmitt trigger 330. The amplitude of the filtered input signal 370 must pass through the hysteresis band 380 in order for the trigger signal 390 to change states.

In FIG. 4C, there is shown the Schmitt trigger output signal 390 which changes states in response to the wide pulse width 400 but not in response to the narrow pulse width 410. The upward pointing arrows superimposed on the input signal 20 illustrate that the flip flop 340 is positive edge triggered and the output state is set according to the state at the data input when the edge is received at the clock input. In FIG. 4D, there is shown the warning signal 120 that appears in response to the narrow pulse width 410. During the positive edge on narrow pulse width 410, the output of the Schmitt trigger is high and the flip flop 340 is set to high to obtain the warning signal as shown. In a similar manner, positive pulses may be detected by setting the flip flop 350 which is negative edge triggered.

It will be obvious to those having ordinary skill in the art that many changes may be made in the details of the above described preferred embodiments of the invention without departing from the spirit of the invention in its broader aspects. For example, the OR gate may be implemented with any sort of summing logic to combine the outputs of the flip flops 340 and 350. The low pass filter 320 may be implemented with any type of circuit that selectively passes signals at a frequency band likely to be missed by the measurement channel, including simple resistor-capacitor (RC) circuits, well known in the art. The Schmitt trigger 330 may be implemented in any form of a level detector that selectively triggers according to signals that pass through at least one predetermined level. Therefore, the scope of the present invention should be determined by the following claims.

What I claim as my invention is:

1. A detector for detecting a pulse width in an input signal comprising:

(a) a low pass filter coupled to receive said input signal to provide a filtered input signal;

(b) a voltage level detector coupled to said low pass filter to receive said filtered input signal and generate a trigger signal;

(c) first and second flip flops, said first flip flop having a data input coupled to said voltage level detector to receive said trigger signal and a clock input coupled to said input signal and said second flip flop having an inverted data input coupled to said voltage level detector to receive said trigger signal and an inverted clock input coupled to said input signal; and (d) an OR gate having first and second inputs coupled to said first and second flip flops to provide a warning signal when said pulse width is less than a predetermined minimum value.

2. A detector for detecting a pulse width in an input signal according to claim 1 further comprising an AND gate interposed between said input signal and said low pass filter and having an input coupled to receive an enable signal wherein said low pass filter receives said input signal when said enable signal is high.

3. A detector for detecting a pulse width in an input signal according to claim 1 wherein said low pass filter has frequency characteristics selected according to said predetermined minimum value.

4. A detector for detecting a pulse width in an input signal according to claim 1 wherein said voltage level detector is a Schmitt trigger.

5. A detector for detecting a pulse width in an input signal according to claim 4 wherein said Schmitt trigger has a hysteresis band and said Schmitt trigger changes state when said filtered input signal passes through said hysteresis band.

6. A detector for detecting a pulse width in an input signal according to claim 1 wherein said input signal is digital.

7. A measurement instrument for measuring an input signal comprising:

(a) a measurement channel coupled to receive said input signal and provide an output signal responsive to said input signal to said measurement instrument wherein said measurement channel is responsive only to a pulse width in said input signal wider than a predetermined minimum value; and (b) a detector coupled to receive said input signal parallel with said measurement channel for providing a warning signal to said measurement instrument wherein said warning signal is generated when said pulse width in said input signal is narrower than said predetermined minimum value for said measurement channel wherein, said detector comprises:

(i) a low pass filter coupled to receive said input signal to provide a filtered input signal;

(ii) a voltage level detector coupled to said low pass filter to receive said filtered input signal and generate a trigger signal;

(iii) first and second flip flops, said first flip flop having a data input coupled to said voltage level detector and a clock input coupled to said input signal and said second flip flop having an inverted data input coupled to said voltage level detector and an inverted clock input coupled to said input signal; and (iv) an OR gate having first and second inputs coupled to said first and second flip flops to provide said warning signal.

8. A measurement instrument for measuring an input signal according to claim 7 wherein said input signal is digital.

9. A measurement instrument for measuring an input signal according to claim 7 wherein said voltage level detector comprises a Schmitt trigger.

10. A measurement instrument for measuring an input signal according to claim 7 wherein said detector further comprises an AND gate interposed between said input signal and said low pass filter and having an input coupled to receive an enable signal wherein said low pass filter receives said input signal when said enable signal is high.

\* \* \* \* \*